(12) United States Patent
Ohta et al.

(10) Patent No.: US 6,268,295 B1
(45) Date of Patent: *Jul. 31, 2001

(54) METHOD OF MANUFACTURING SEMICONDUCTOR DEVICE

(75) Inventors: Hiroyuki Ohta; Hidekazu Satoh, both of Kanagawa (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/105,008

(22) Filed: Jun. 26, 1998

(30) Foreign Application Priority Data

Nov. 27, 1997 (JP) .................................. 9-326106

(51) Int. Cl.⁷ ............... H01L 21/302; H01L 21/461; H01L 21/336; H01L 21/8238
(52) U.S. Cl. .............. 438/735; 438/199; 438/303; 438/636; 438/744; 438/757; 438/791
(58) Field of Search ................. 438/744, 745, 438/757, 756, 636, 199, 303, 305, 306, 299, 791, 735

(56) References Cited

U.S. PATENT DOCUMENTS

| | | | |
|---|---|---|---|
| 3,549,411 | * 12/1970 | Bean et al. | 438/791 |
| 4,269,654 | * 5/1981 | Deckert et al. | 156/657 |
| 5,812,364 | * 9/1998 | Oku et al. | 361/312 |
| 5,968,324 | * 10/1999 | Cheung et al. | 204/192.28 |
| 5,973,349 | * 10/1999 | Ikemasu et al. | 257/307 |

FOREIGN PATENT DOCUMENTS

403219628 * 9/1991 (JP) .

OTHER PUBLICATIONS

Kirt et al, Etch Rates for Micromaching Processing, Jouranl of Microelectromechanical System, vol. 5, No. 4, pp 256–269, Dec. 1996.*

* cited by examiner

*Primary Examiner*—Charles Bowers
*Assistant Examiner*—Thanhha Pham
(74) *Attorney, Agent, or Firm*—Armstrong, Westerman, Hattori, McLeland, & Naughton, LLP

(57) ABSTRACT

A method of manufacturing a semiconductor device comprises the steps of forming a first film over a semicondutor substrate, introducing a reaction gas including a dilution gas into a reaction atmosphere and then growing a antireflection film made of silicon nitride or silicon nitride oxide on the first film by a plasma chemical vapor deposition method in the reaction atmosphere, coating resist on the antireflection film directly or via a second film and then patterning the resist via exposure and development, patterning the first film located in an area not covered with the resist by etching, and removing the antireflection film by use of hydrofluoric acid after patterning of the first film, whereby expansion of impurity diffusion can be prevented and also retreat of sidewalls can be suppressed.

13 Claims, 16 Drawing Sheets

$a_1$ : First ARL-SIN $a_2$ : Second ARl-SIN

FIG. 12    (Prior Art)
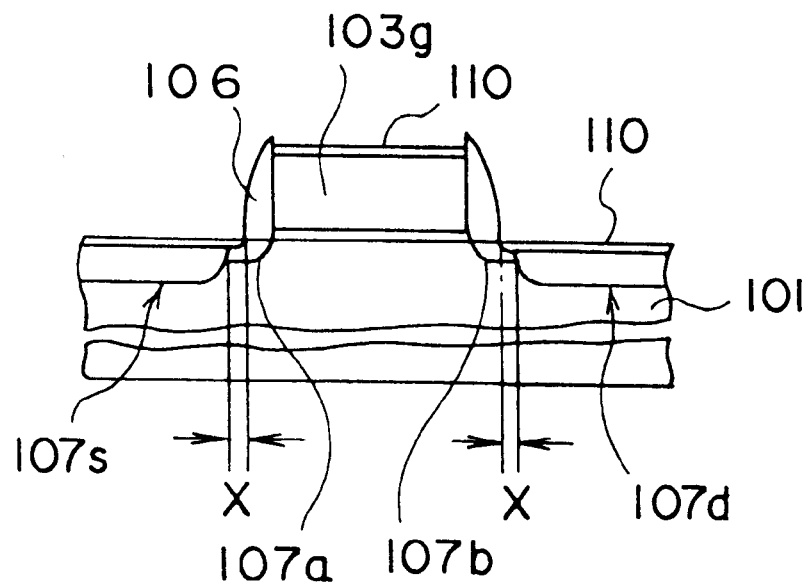
FIG. 13    (Prior Art)
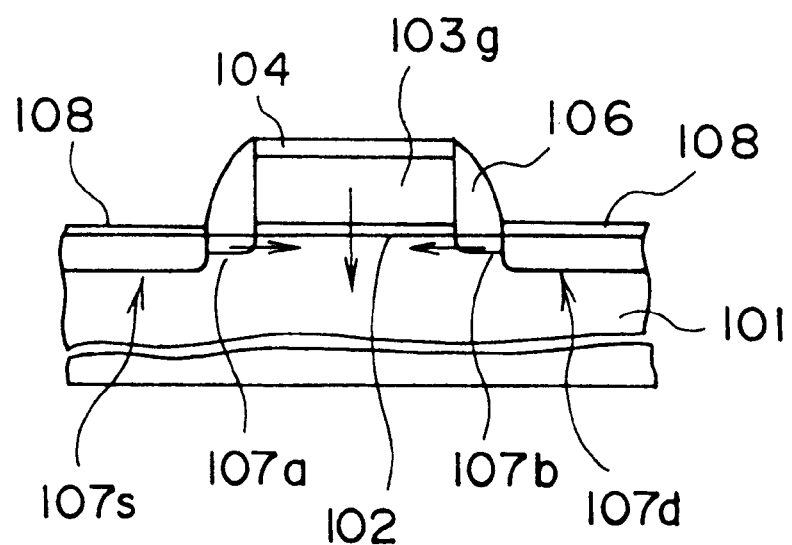

METHOD OF MANUFACTURING SEMICONDUCTOR DEVICE

BACKGROUND OF THE INVENTION

1. Field of the Invention

The present invention relates to a method of manufacturing a semiconductor device and, more particularly, a method of manufacturing a semiconductor device including a step employing a light antireflection film upon exposure.

2. Description of the Prior Art

In order to improve performance of a semiconductor integrated circuit device, a higher integration degree and a higher speed operation of a semiconductor device have been requested. Miniaturization of a MOS transistor which is as a representative semiconductor device has been requested, for instance.

In the MOS transistor, size reduction of respective constituent elements in both a width direction and a thickness direction has been advancing. There has been such tendencies that, for example, a thickness of a silicon dioxide film used as a gate insulating film is made thinner than 10 nm and depths of extension source/drain layers become less than 100 nm.

A lithography technique performs a critical role in miniaturization of the MOS transistor. In general, various patterns can be formed with the use of optical exposure technique. However, in recent, it has not been seldom that a KrF excimer laser light (248 nm) can be used to develop a miniaturized MOS transistor. It is optical reflection that becomes an issue upon utilizing such exposure technique. In patterning a light reflecting film such as metal, silicon, or the like, light reflection has been suppressed by forming a antireflection film on the light reflecting film and then coating resist thereon.

Normally there are used silicon nitride or silicon nitride oxide as material used for the antireflection film.

If such antireflection film is applied to execute patterning of a gate electrode of the MOS transistor, the antireflection film remains on the gate electrode. In many cases, the antireflection film is removed after the gate electrode has been formed.

For example, as shown in FIG. 11A, a gate insulating film 102, an impurity containing polysilicon film 103, and a antireflection film 104 are formed in sequence on a silicon substrate 101, and resist 105 is then coated on the antireflection film 104. The resist 105 is patterned via exposure and developing processes to have a planar shape of the gate electrode. Then, as shown in FIG. 11B, with the use of the patterned resist 105 as a mask, the antireflection film 104 to the gate insulating film 102 are etched. Thus, the polysilicon film 103 may serve as a date electrode 103g. In addition, impurity ions are implanted into the silicon substrate 101 for the first time with the use of The gate electrode 103g as a mask, then sidewalls are formed on both side surfaces of the gate electrode 103g, and then impurity ions are implanted into the silicon substrate 101 for the second time with the use of the gate electrode 103g and the sidewalls 106 as a mask. Shallow and low concentration impurity diffusion layers 107a, 107b are formed by the first impurity ion implantation and also deep and high concentration impurity diffusion layers are formed by the second impurity ion implantation, whereby a source layer 107s and a drain layer 107d both having an LDD structure can be constructed. Thereafter, as shown in FIG. 11C, a silicon oxide film 108 is formed by thermally oxidizing a surface of the silicon substrate 101 at about 800° C. In this state, as shown in FIG. 11D, the antireflection film 104 is removed by use of a phosphoric solution.

By the way, if silicon nitride which is grown by plasma CVD is employed as material for the antireflection film 104, it is common to remove the antireflection film 104 with the use of the phosphoric solution.

However, if phosphoric acid is used to remove the antireflection film 104 made of silicon nitride, it is likely that a surface of the silicon substrate 101 is made uneven by the phosphoric acid. In addition, if the surface of the silicon substrate 101 is brought directly into contact with the phosphoric acid, such surface is susceptible to α particles due to polonium contamination to thus cause soft errors.

Therefore, as shown in FIG. 11C, commonly such a method has been employed that, prior to removal of the antireflection film 104 made of silicon nitride, a protection film (108) made of SiO$_2$ is formed on the surface of the silicon substrate 101 by thermally oxidizing the surface of the silicon substrate 101.

In addition, since the sidewalls of the gate electrode 103g are exposed when thermal oxidation is to be carried out, insulating sidewalls 106 are formed on the sidewalls of the gate electrode 103g, as shown in FIG. 11C, in order to prevent oxidation of the sidewalls.

However, if the sidewalls 106 is made up of silicon nitride, the sidewalls 106 are made thinner and moved back simultaneously with removal of the antireflection film 104 which is also made of silicon nitride.

In the event that the sidewalls 106 are formed by such thinner layer, low concentration impurity diffusion layers 107a, 107b of the source/drain layers 107s, 107d having the LDD structure are exposed by a width X, as shown in FIG. 12. For this reason, if a silicide film 110 is formed on surfaces of the source/drain layers 107s, 107d, the silicide film 110 is superposed on the low concentration impurity diffusion layers 107a, 107b. As a result, junction breakdown is liable to cause in the low concentration impurity diffusion layers 107a, 107b.

If thermal oxidation of the surface of the silicon substrate 101 is needed, such thermal oxidation is to be performed at high temperature in the range of 700° C. to 900° C. As shown in FIG. 13, according to the temperature to such extent, impurity contained in the gate electrode 103g is caused to punch through the gate insulating film 102 and to diffuse into the silicon substrate 101, otherwise impurity contained in the impurity diffusion layers 107a, 107b in the silicon substrate 101 is caused to diffuse laterally. As a consequence, such a problem has been caused that a short channel effect becomes worse.

SUMMARY OF THE INVENTION

It is an object of the present invention to provide a method of manufacturing a semiconductor device which is capable of preventing expansion of impurity diffusion in a semiconductor substrate and also suppressing retreat of side walls, during a step of removing a antireflection film made of silicon nitride or silicon nitride oxide.

According to the present invention, the silicon nitride or the silicon nitride oxide constituting the antireflection film is grown by the plasma CVD (chemical vapor deposition) method using the reaction gas containing the dilution gas such as nitrogen, argon, or helium. In this case, it is preferable that the antireflection film is grown at the temperature of less than 350° C. and more than 200° C.

The silicon nitride or the silicon nitride oxide grown on or over the semiconductor substrate under such conditions has the high etching rate due to the hydrofluoric acid and in addition the hydrofluoric acid never causes unevenness of the surface of the semiconductor substrate. As a result, the step of growing the oxide film on the surface of the semiconductor substrate by thermal oxidation as pre-process to remove the antireflection film can be omitted and also impurity rediffusion by the thermal oxidation can be prevented.

Furthermore, even if the silicon oxide film is used as material for the sidewall, the etching rate of the silicon nitride or silicon nitride oxide due to the hydrofluoric acid can be increased more than ten times the silicon oxide film and also retreat of the sidewalls can be suppressed.

In the event that the silicon nitride is used as material for the sidewalls, the sidewalls are scarcely etched by the hydrofluoric acid if the silicon nitride for the sidewalls is grown by the thermal CVD method. For this reason, the antireflection film can be selectively etched and therefore retreat of the sidewalls does not appear.

BRIEF DESCRIPTION OF THE DRAWINGS

FIG. 12 is a sectional view showing retreat of side walls of the MOS transistor formed according to the method in the prior art; and FIG. 13 is a sectional view showing impurity rediffusion in the MOS transistor formed according to the method in the prior art.

DESCRIPTION OF THE PREFERRED EMBODIMENTS

Therefore, embodiments of the present invention will be explained in detail with reference to the accompanying drawings hereinafter.

The inventors of the present invention have examined growth and removal conditions for the silicon nitride film, which are able to prevent unevenness of a surface of a silicon substrate (semiconductor substrate) and to omit a step of forming a thermal oxidation film on the surface of the silicon substrate if a silicon nitride film is employed as a antireflection film. Then, the inventors have attempted the experiment to confirm the examination result.

In addition, the inventors of the present invention have also examined that the sidewalls can be prevented from being made thinner during removal of the antireflection film, by differentiating an etching rate of insulating sidewalls formed on side surfaces of the gate electrode and an etching rate of a antireflection film made of silicon nitride.

First, a method of growing a silicon nitride film as constituent material for a antireflection film will be explained. The silicon nitride film has been grown by virtue of a parallel plate type plasma chemical vapor deposition (CVD) equipment exemplified in FIG. 1.

Figure 1:
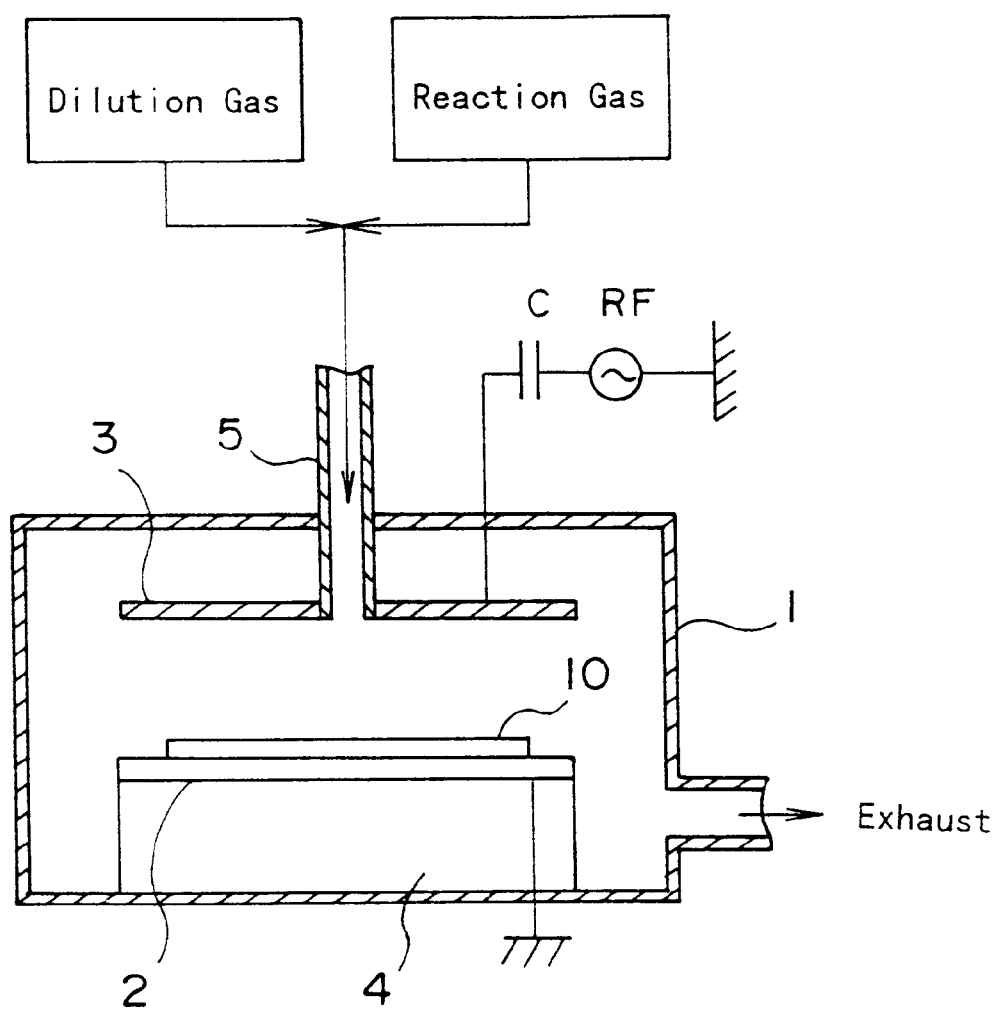
FIG. 1 is a view showing a configuration of a parallel plate type plasma CVD equipment used in embodiments of the present invention.

In a chamber 1 of the plasma CVD equipment shown in FIG. 1, first and second electrodes 2, 3 each having a diameter of 75 mm are placed at a distance to oppose to each other. In addition, an area on which a silicon substrate 11 is loaded is provided on the first electrode 2, and an electrode heating lamp 4 is provided in the neighborhood of the first electrode 2. A high frequency power supply RF of 13.56 MHz is connected to the second electrode 3, and a capacitor C is provided between the high frequency power supply RF and the second electrode 3 to cut off a direct current component. A power of the high frequency power supply RF is set to 75 to 80 W, and a pressure in the chamber 1 is held at 3 Torr.

A plurality of samples in which film quality of the silicon nitride film is made different by changing the growth conditions have been prepared by using the above plasma CVD equipment, and an etching rate of the silicon nitride film in terms of phosphoric acid has been examined. An etching rate of the silicon nitride film formed by the plasma CVD method (referred to as a "plasma nitride film" hereinafter) is compared with an etching rate of a silicon dioxide film grown by a thermal oxidation method, and then differences in the etching rates have been represented by etching rate ratios.

The silicon dioxide film as the sample has been grown on the silicon substrate by thermal oxidation at a temperature of 700° C. to 900° C., which is referred to as a thermal oxidation film hereinafter. Further, all films whose etching rates are compared are formed to have a uniform thickness of 100 nm.

In order to grow the silicon nitride film by virtue of the plasma CVD method, silane ($SiH_4$) and ammonia ($NH_3$) have been employed as a growth gas. If the growth gas is diluted with a nitrogen gas, it has been examined how the film quality of the plasma nitride film is changed according to a flow rate of a nitrogen gas an how the etching rate of the plasma nitride film due to hydrofluoric acid is changed.

Figure 2:
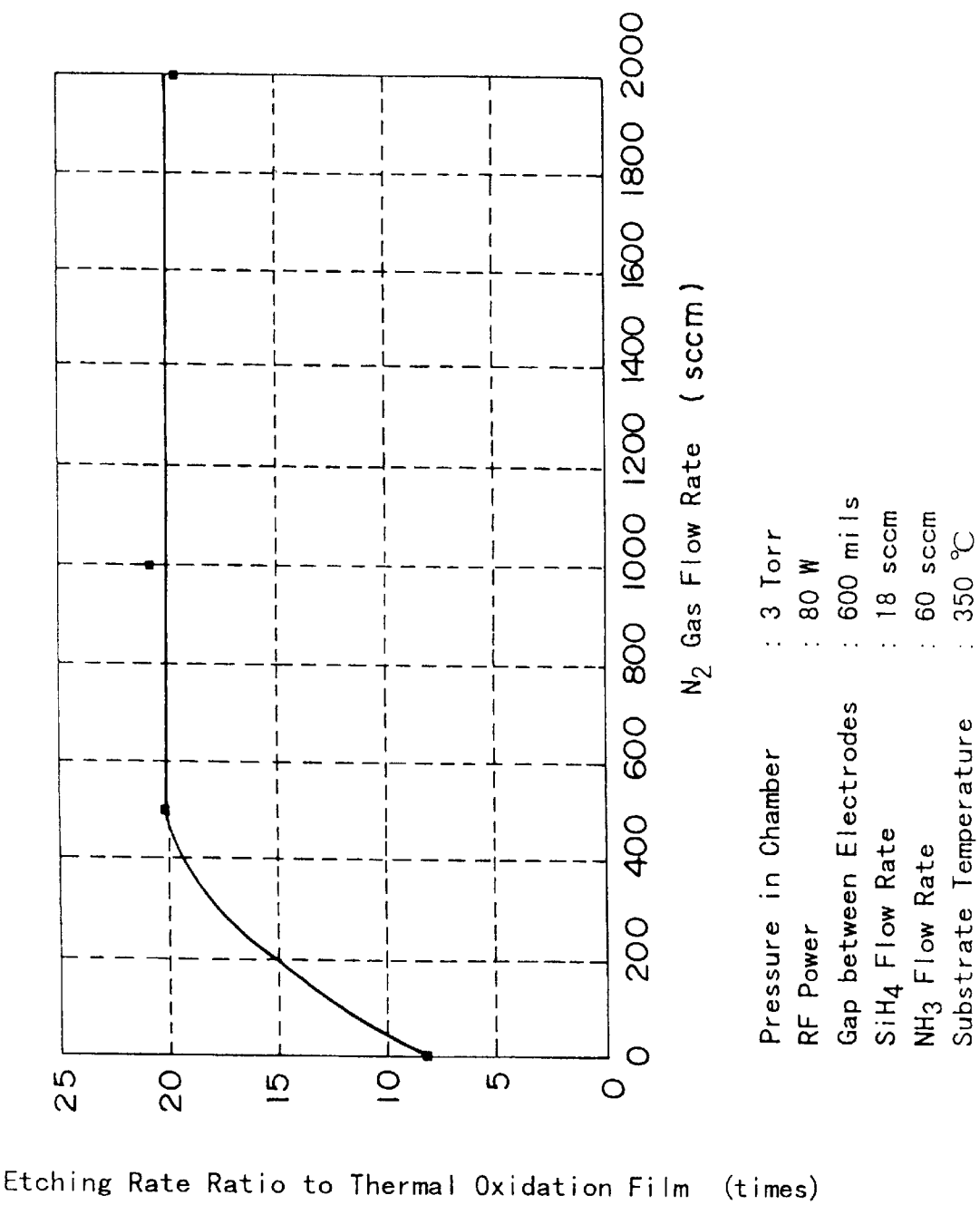
FIG. 2 is a view showing a relationship between a flow rate of nitrogen gas used as a dilution gas upon growing a silicon nitride film by a plasma CVD method and an etching rate ratio of a silicon nitride film to a thermal oxidation film.

FIG. 2 shows an experimental result to check a relationship between a flow rate of the nitrogen gas and the etching rate ratio of the silicon nitride film to the thermal oxidation film, wherein an ordinate indicates the etching rate ratio ($\beta/\gamma$) and an abscissa indicates the flow rate of the nitrogen gas after the etching rate β of the plasma nitride film has been examined in contrast to the etching rate γ of the thermal oxidation film when the hydrofluoric acid is employed as an etching solution.

According to FIG. 2, the etching rate ratio is increased as the nitrogen gas is increased from 0 sccm to 500 sccm, but the increase in the etching rate ratio is saturated when the nitrogen gas is in excess of 500 sccm. Accordingly, it has been found that, in order to enhance the etching rate of the plasma nitride film, it is effective to dilute the reaction gas by the nitrogen gas and in addition the etching rate by the hydrofluoric acid can be controlled to some extent by adjusting the flow rate of the nitrogen gas.

Next, it has been examined how film quality of the silicon nitride film is changed by varying the flow rate of the nitrogen gas.

Figure 3:
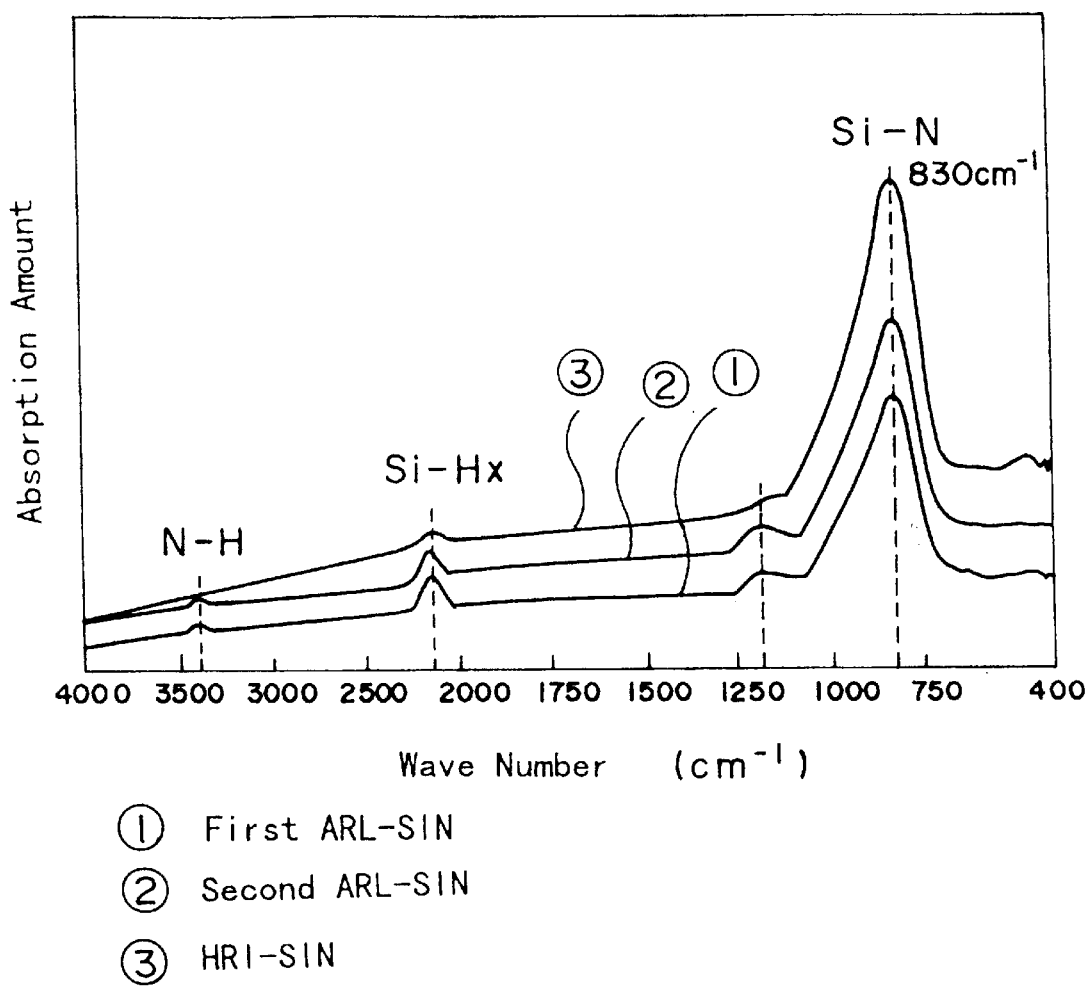
FIG. 3 is a view showing differences in an Si—N bond amount according to a plurality of silicon nitride films formed by the plasma CVD method while changing conditions.

FIG. 3 shows the result of FT-IR measurement of three types of silicon nitride films which are formed while changing the flow rate of the nitrogen gas in growing the plasma nitride film. First, second, and third silicon nitride films have been formed under the conditions given in Table 1. The first and second silicon nitride films have been grown at the low substrate temperature like 350° C., while the third silicon nitride film has been grown at the high substrate temperature like 480° C. In addition, the first silicon nitride film has been grown at the flow rate of the nitrogen gas as the dilution gas of 500 sccm, the first silicon nitride film has been grown without the dilution gas, and the third silicon nitride film has been grown at the flow rate of the dilution gas of 2125 sccm. The first, second, and third silicon nitride films will be called a first ARL-SIN, a second ARL-SIN, and an HRI-SIN respectively in the following.

TABLE 1

HRI-SIN

Temperature: 480° C.   Pressure: 5.5 Torr,
PF power: 240 W,
Gap between electrodes: 360 mils
Gas: $SiH_4/N_2/NH_3 = 70/2125/30$ sccm
ARL-SIN (First)

Temperature: 350° C.   Pressure: 3.0 Torr,
PF power: 75 W,
Gap between electrodes: 600 mils
Gas: $SiH_4/N_2/NH_3 = 34/500/60$ sccm
ARL-SIN (Second)

Temperature: 350° C.   Pressure: 1.5 Torr,
PF power: 50 W,
Gap between electrodes: 600 mils
Gas: $SiH_4/N_2/NH_3 = 18/0/60$ sccm According to FIG. 3, there have existed peaks, as a matter of course, at wave number 830 cm$^{-1}$ indicating Si—N bond in the first and second ARL-SINs and the HRI-SIN. In FIG. 3, the second ARL-SIN has included a larger Si—N bond amount than the first ARL-SIN. In addition, the HRI-SIN has included a larger Si—N bond amount than the second ARL-SIN.

Figure 4:
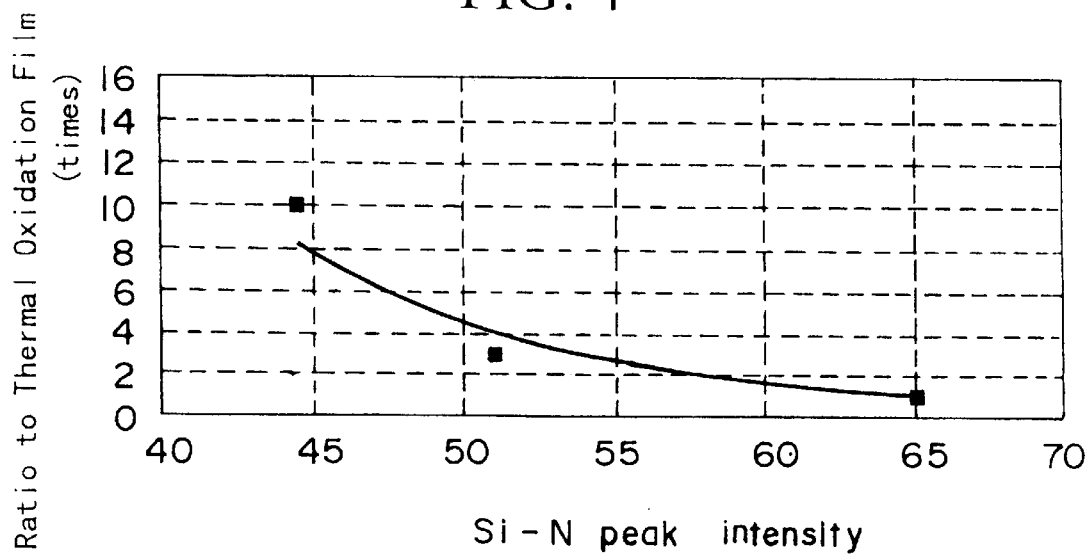
FIG. 4 is a view showing a relationship between an Si—N bond amount in the silicon nitride film and the etching rate ratio of the silicon nitride film to the thermal oxidation film.

Moreover, when the etching rate ratios of the first to third silicon nitride films to the thermal oxidation film are measured, the result shown in FIG. 4 has been derived. It can be understood that, regardless of the growth conditions, the etching rate ratio becomes smaller as a peak intensity of the Si—N bond amount becomes higher.

From FIGS. 3 and 4, the followings have become evident.

More particularly, even in the film like the HRI-SIN which is grown by use of the dilution gas, the etching rate is smaller if the growth temperature is higher and also the etching rate ratio to the thermal oxidation film becomes less than one time. On the contrary, the etching rate due to the hydrofluoric acid has been able to be increased in the silicon nitride film grown at the low temperature of about 350° C. if the dilution gas is employed, and the etching rate ratio of the first ARL-SIN to the thermal oxidation film has become ten times.

With the above, it can be guessed that there is correlation between the hydrofluoric acid and the Si—N bond amount in the silicon nitride film and that the silicon nitride film which has the higher etching rate due to the hydrofluoric acid signifies a nondense or coarse film that has the smaller Si—N bond amount per unit volume.

Figure 5:
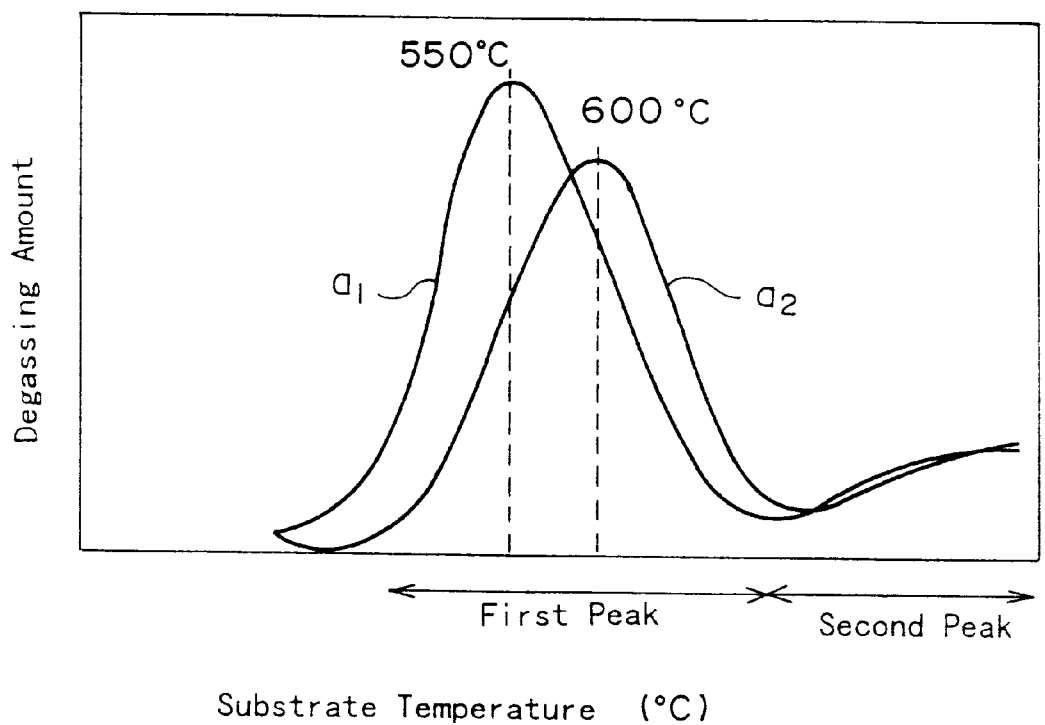
FIG. 5 is a view showing differences in degassing characteristics according to differences in growth conditions of the silicon nitride film.

Besides, if degassing temperatures of the first ARL-SIN and the second ARL-SIN are measured respectively, the results shown in FIG. 5 have been derived. According to FIG. 5, it has been found that the etching rate due to the hydrofluoric acid becomes quicker in the first ARL-SIN wherein degassing occurs from the low temperature because hydrogen molecules remain in the film, whereas the etching rate due to the hydrofluoric acid becomes slower in the second ARL-SIN wherein degassing occurs from the high temperature because hydrogen molecule residue amount is small in the film.

Figure 6:
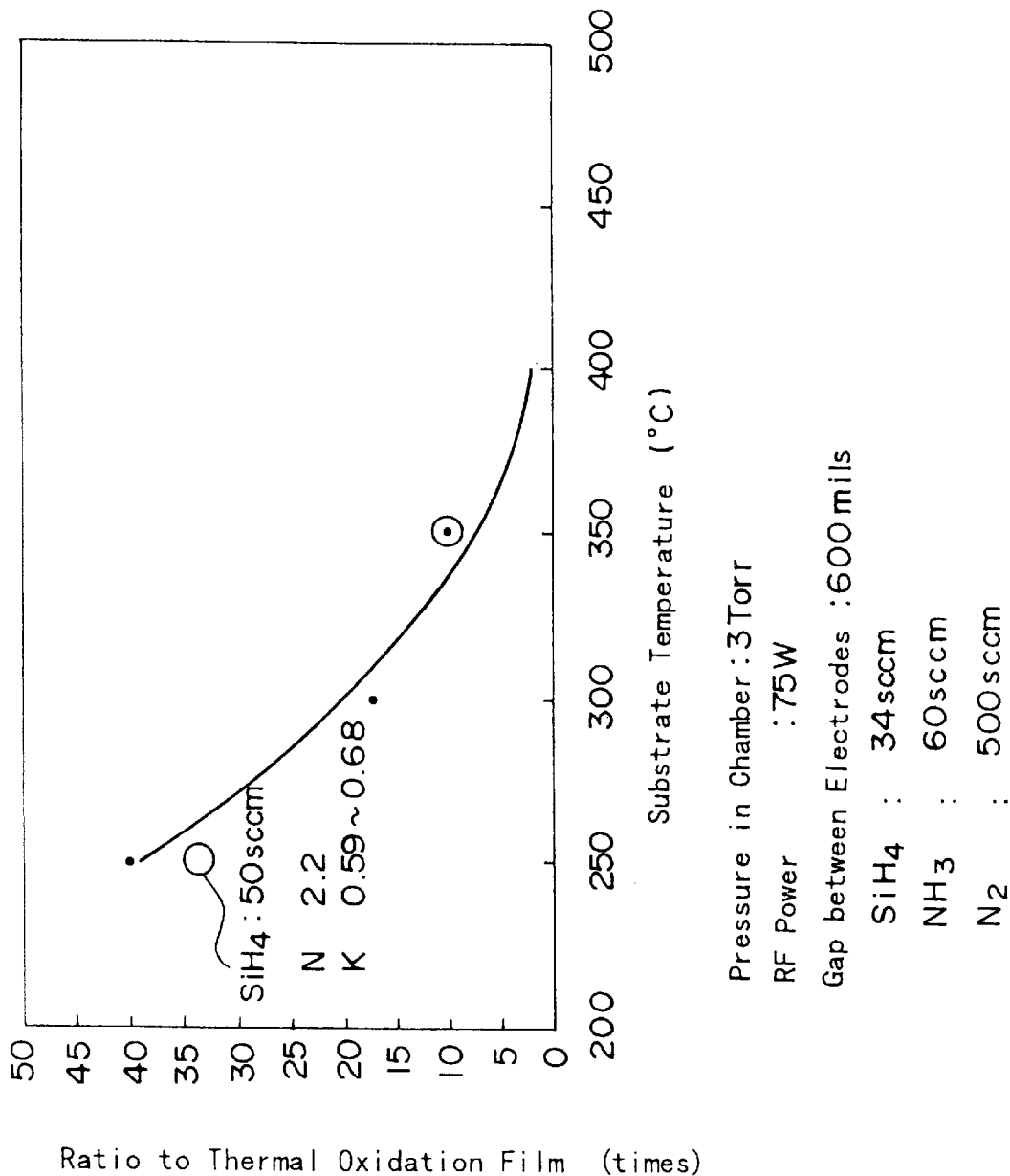
FIG. 6 is a view showing a relationship between a substrate temperature of the silicon nitride film and the etching rate ratio of the silicon nitride film to the thermal oxidation film.

By examining temperature dependence of the etching rate of the silicon nitride film grown by the plasma CVD method due to the hydrofluoric acid, the result shown in FIG. 6 has been derived. If the growth temperature is lower, the etching rate ratio to the thermal oxidation film becomes higher. Also, it has been found that the etching rate ratio of the silicon nitride film which is grown at 400° C. to the thermal oxidation film becomes 1 and therefore the silicon nitride film cannot be selectively etched with respective to the thermal oxidation film.

In this case, if the reaction gas is diluted by the nitrogen gas in growing the silicon nitride film by the plasma CVD method, optical characteristics of the silicon nitride film are slightly changed. In other words, a refractive index N and an attenuation constant are reduced as the dilution gas is added much more, nevertheless they can be adjusted to some extent by controlling the flow rate of the silane gas.

A reaction formula for etching of the silicon nitride film due to the hydrofluoric acid can be given as follows.

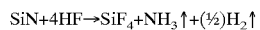

$$SiN + 4HF \rightarrow SiF_4 + NH_3 \uparrow + (\tfrac{1}{2})H_2 \uparrow$$

Figure 7:
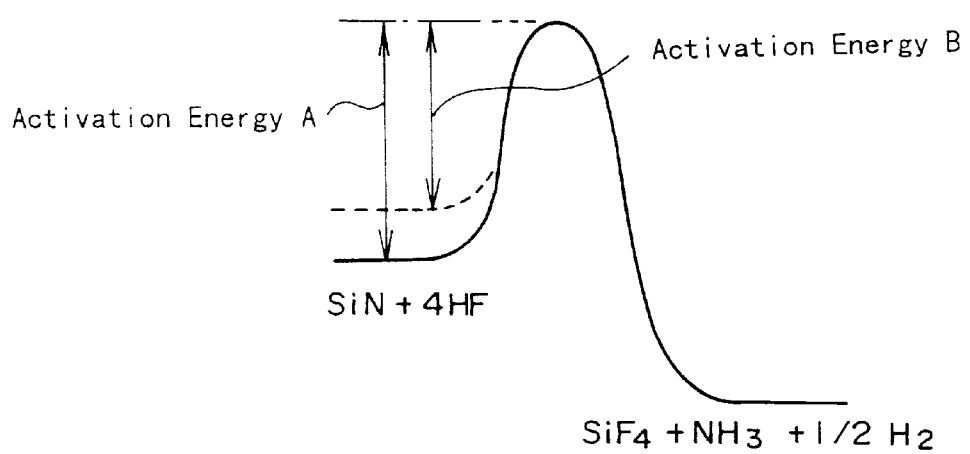
FIG. 7 is a view illustrating a relationship between activation energy in the silicon nitride film and film quality.

This reaction will be discussed based on FIG. 7.

Assume that the activation energy A necessary for phase change from a left state to a right state in the reaction formula is present, if the reaction according to the above reaction formula is caused, potential energy is high in the film having a dense defect density. Therefore, the sufficient activation energy necessary for the phase change can be obtained by B. Thereby, it has been supposed that a hydrofluoric acid rate is increased higher. Since the optical constants required as the antireflection film is supposed to be controlled by the composition ratio, such optical constants are not so affected by the defect density. The film having the dense defect density includes the case where the Si—N bond is extended.

With the above, it has been deduced that, after the dilution gas has been introduced, preferably the silicon nitride film is grown by the plasma CVD method at the temperature of less than 350° C. to be used as the antireflection film.

If the sidewalls which are to be formed on the side surfaces of the gate electrode of he MOS transistor are formed by the silicon nitride film, it is undesirable that the silicon nitride film is thinned by the hydrofluoric acid. Therefore, the silicon nitride film constituting the sidewall should be grown at the temperature of 650° C. to 800° C. by the thermal CVD method while using dichlorosilane (SiCl$_2$H$_2$) and ammonia (NH) as the reaction gas. In the silicon nitride film which is grown by the thermal CVD method in this manner, the etching rate due to the hydrofluoric acid becomes extremely slow.

The dilution gas used to grow the silicon nitride film by the plasma CVD method is not limited to the nitrogen gas, but any of argon gas and helium gas, or a gas containing any of nitrogen gas, argon gas, and helium gas may be used.

Although the etching rate of the silicon nitride film has been discussed in the above description, similar etching tendency appears in the silicon nitride oxide film grown by the plasma CVD method using the reaction gas into which oxygen is mixed.

Then, steps of manufacturing the MOS transistor which uses the silicon nitride film having the higher etching rate due to the hydrofluoric acid explained as above as the antireflection film will be explained. Subsequently, steps of forming a capacitor in a DRAM cell using such antireflection film will be explained in order.

(First Embodiment)

FIGS. 8A to 8I are sectional views showing steps of forming a p-type MOS transistor according to an embodiment of the present invention.

Figure 8A:
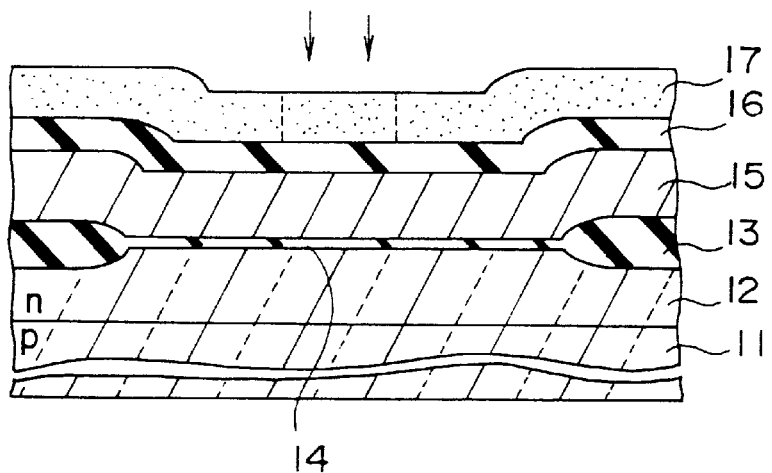
FIGS. 8A to 8I are sectional views showing steps of manufacturing a MOS transistor employing an embodiment of the present invention.

First, forming steps until a structure shown in FIG. 8A can be formed will be explained hereunder.

In other words, a field oxide film 13 is formed by a selective etching method on a surface of an n-type well 12 formed on the silicon substrate 11 to surround a device forming region. Then, an SiO$_2$ film of 4 nm thickness is formed by thermally oxidizing the surface of the device forming region of the silicon substrate 11.

Next, a polysilicon film 15 containing impurity is formed on the gate insulating film 14 by the CVD method to have a thickness of 180 nm. Then, a first silicon nitride film of 29 nm thickness is grown thereon by the plasma CUED method. The first silicon nitride film is used as a antireflection film 16.

The first silicon nitride film can be grown by the parallel type plasma CVD equipment shown in FIG. 1, for example. A gap between the first electrode 2 and the second electrode 3 is set to 600 mils (15.42 mm)

While using the above plasma CVD equipment, silane (SiH$_4$) and ammonia (NH$_3$) are introduced as the growth gas from a gas introducing pipe 5 into a chamber 20 at the flow rates of 18 sccm and 60 sccm respectively, and also nitrogen (N$_2$) is introduced as the dilution gas at the flow rate of more than 500 sccm. The temperature of the first electrode 2 is set to the low temperature of 350° C. to 200° C. and a power of the high frequency power supply PF is set to 80 W.

The first silicon nitride film being grown under such conditions has film quality which can be readily etched by the hydrofluoric acid.

Figure 8B:
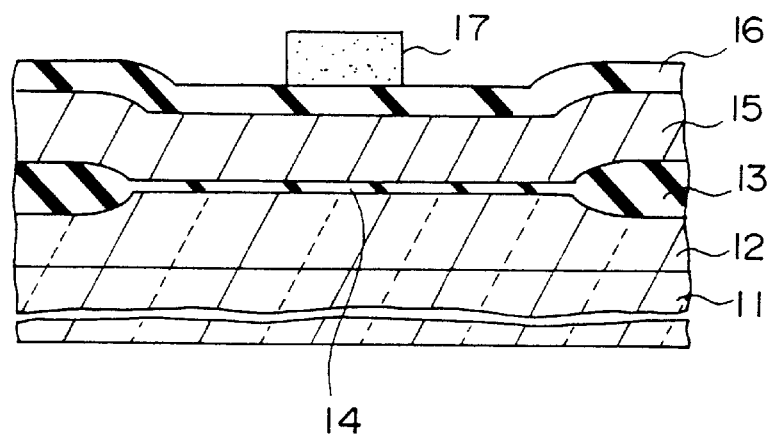

After the antireflection film 16 has been grown in this manner, photoresist 17 is coated on the antireflection film 16 and then the photoresist 17 is exposed. Thus, reflection of the light can be prevented by the antireflection film 16 and therefore precision in exposure can be improved. The photoresist 17 can be built by this exposure in an area in which the gate electrode is to be formed. After this exposure, as shown in FIG. 8B, the photoresist 17 is left by developing the photoresist 17 in a region wherein a gate electrode is to be formed.

Figure 8C:
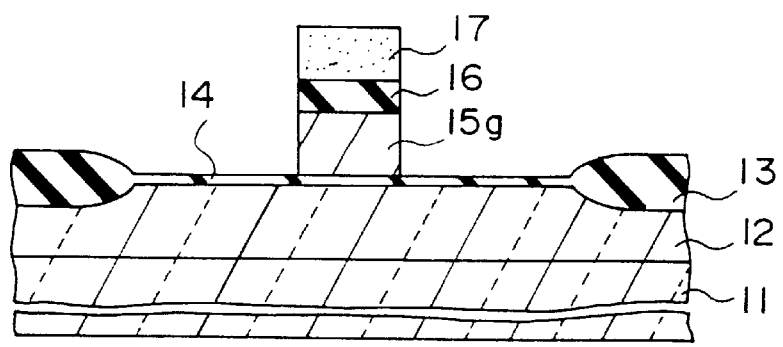

Next, as shown in FIG. 8C, the antireflection film 16 and the polysilicon film 15 are etched while using the photoresist 17 as a mask, whereby the polysilicon film 15 is left as a gate electrode 15g only beneath the photoresist 17. CF4 is utilized as an etchant of the antireflection film 16, and HBr is utilized as an etchant of the polysilicon film 15.

In the next, the photoresist 17 is removed by an solvent.

Figure 8D:
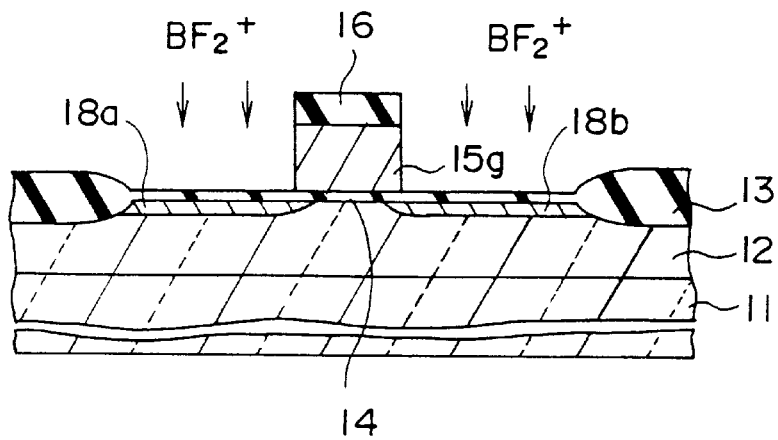

Then, boron fluoride ion (BF$^{2+}$) is implanted into a well 12 at a dosage of $1 \times 10^{14}$ atoms/cm$^2$ with using the gate electrode 15g and the field oxide film 13 as a mask, whereby p-type low concentration impurity diffusion layers 18a, 18b are formed on both sides of the gate electrode 15g in a self-alignment fashion, as shown in FIG. 8D.

After this, the second silicon nitride film 21 is formed on an overall surface of the resultant structure by the CVD method. At that time, the growth conditions for the second silicon nitride film 21 are made different from those for the first silicon nitride film (16) constituting the antireflection film 16. For instance, the second silicon nitride film 21 is grown at the temperature of 650° C. to 800° C. by the thermal CVD method with the use of the reaction gas which is composed of dichlorosilane (SiCl$_2$H$_2$) and ammonia (NH$_3$)

Figure 8E:
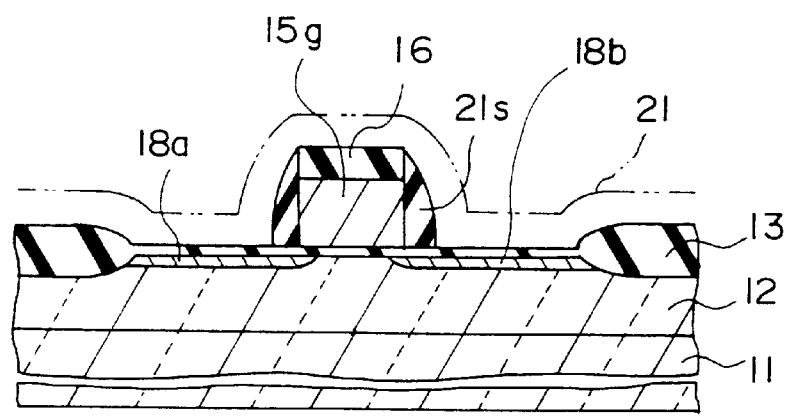

After the second silicon nitride film 21 has been grown under such conditions, such second silicon nitride film 21 is left on side surfaces of the gate electrode 15g, as shown in FIG. 8E, when the second silicon nitride film 21 is anisotropically etched in the vertical direction in terms of the reactive ion etching (RIE) method. The second silicon nitride film 21 being left on the side surface of the gate electrode 15g will be referred to as a sidewall 21s hereunder.

Figure 8F:
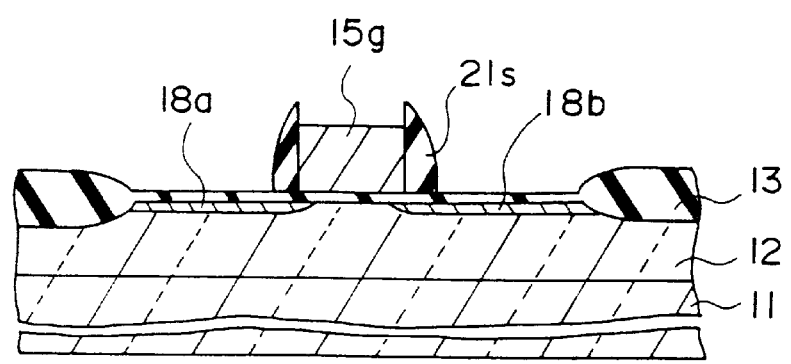

Next, as shown in FIG. 8F, the antireflection film 16 made of the first silicon nitride film can be removed by use of a hydrofluoric solution. In this case, based on its growth conditions, the second silicon nitride film 21 constituting the sidewall 21s is brought into a state where it is difficult to be etched by the hydrofluoric acid.

By removing the antireflection film 16 by the hydrofluoric acid in this manner, there is no possibility that unevenness of the surface of the silicon substrate 11 is caused.

Figure 8G:
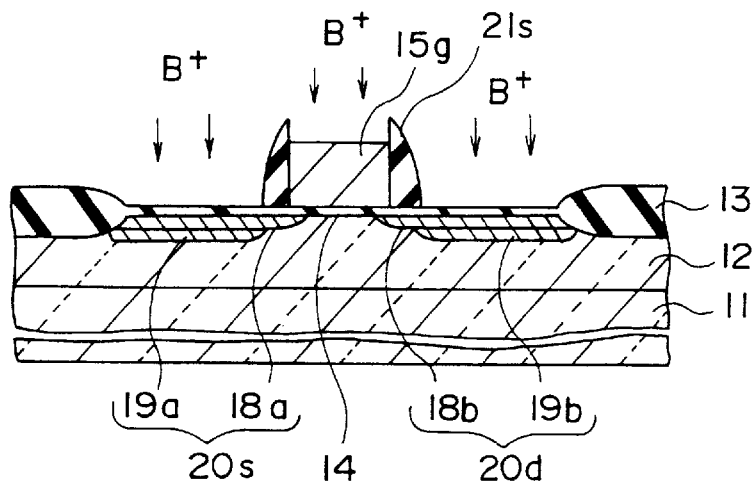

Thereafter, using the gate electrode 15g and the sidewalls 21s as a mask, boron ion (B+) is ion-implanted into the well 12 at a dosage of $3 \times 10^{15}$ atoms/cm. As a result, as shown in FIG. 8G, high concentration impurity diffusion layers 19a, 19b are formed on the outside of the gate electrode 15g and the sidewalls 21s. The high concentration impurity diffusion layers 19a, 19b as well as the low concentration impurity diffusion layers 18a, 18b constitute the source layer 20s and the drain layer 20d both having the LDD structure respectively. In place of the LDD structure source/drain layers, extension source/drain layers may be employed.

Figure 8H:
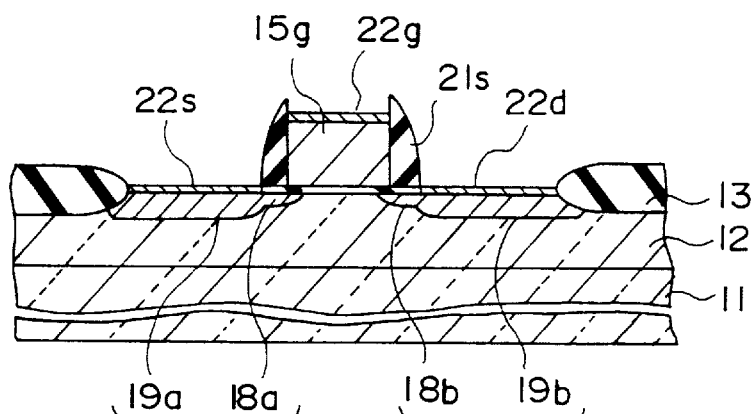

After this, an oxide film formed on the source layer 20s and the drain layer 20d is removed by the hydrofluoric acid, then a refractory metal film, e.g., a cobalt (Co) film is formed by sputtering on the overall surface, and then the surface of the substrate is annealed at the temperature of 840° C. Thus the refractory metal reacts with silicon, so that cobalt silicide layers 22s, 22d are formed on the upper surfaces of the high concentration impurity diffusion layers 19a, 19b, as shown in FIG. 8H. In addition, a cobalt silicon layer 22g is formed on the upper surface of the gate electrode 15g.

The cobalt silicide layers 22s, 22d formed on the high concentration impurity diffusion layers 19a, 19b are seldom expanded onto the low concentration impurity diffusion layers 18a, 18b. This is because the side surface of the sidewall 21s is hardly caused to retreat toward the gate electrode 15g in removing the antireflection film 16.

Unreacted cobalt can be removed by persulfuric acid.

Figure 8I:
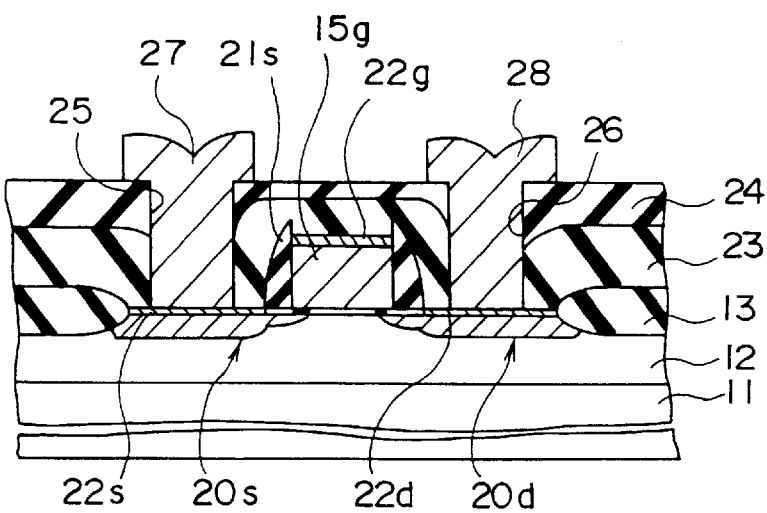

Then, as shown in FIG. 8I, the first-layered interlayer insulating film 23 is formed under the conditions wherein the growth rate is isotropic, and then the second-layered interlayer insulating film 24 for planarization is formed. Further, contact holes 25, 26 are formed on the source layer 20a and the drain layer 20d by etching these films, and then a source extension electrode 27 is connected to the contact hole 25 on the source layer 20s and a drain extension electrode 28 is connected to the contact hole 26 on the drain layer 20d.

In the above-mentioned steps of forming the MOS transistor, the growth conditions for the first silicon nitride film constituting the antireflection film 16 and the growth conditions for the second silicon nitride film 21 constituting the sidewall 21s have been set differently such that the first silicon nitride film can be easily removed by the hydrofluoric acid rather than the second silicon nitride film 21. For this reason, retreat of the sidewall 21s seldom occurs and also the silicide layers 12s, 12d formed on the high concentration impurity diffusion layers 19a, 19b can be prevented from extending onto the low concentration impurity diffusion layers 18a, 18b, so that junction breakdown at the low concentration impurity diffusion layer 18b as the drain region can be prevented.

Since growth of the thermal oxidation film to protect the surface of the silicon substrate 11 upon removing the antireflection film 16 can be omitted, both diffusion of impurity contained in the source layer 20s and the drain layer 20d on the silicon substrate 11 and punch-through of impurity contained in the gate electrode 15g into the silicon substrate 11 via the gate insulating film 14 can be prevented. As a result, a short channel effect can be reduced.

In FIGS. 8D to 8I, the antireflection film has been removed after formation of the sidewall. However, as shown in FIGS. 9A to 9F, the sidewalls may be formed after removal of the antireflection film.

Figure 9A:
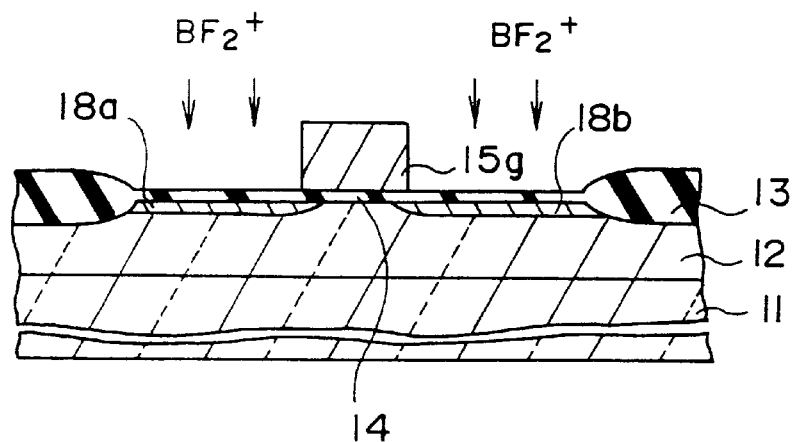
FIGS. 9A to 9F are sectional views showing steps of manufacturing another MOS transistor employing another embodiment of the present invention.

More particularly, as shown in FIG. 9A, after the gate electrode 15g has been formed, the resist is removed and then the antireflection film 16 is removed by the hydrofluoric acid. Subsequently, impurity is introduced into the wells 12 with the use of the gate electrode 15g as a mask. Since impurity is also introduced into the gate electrode 15g at this time, there is no necessity of introducing impurity into the polysilicon film 15 at the same time when such polysilicon film 15 constituting the gate electrode 15g is grown.

Figure 9B:
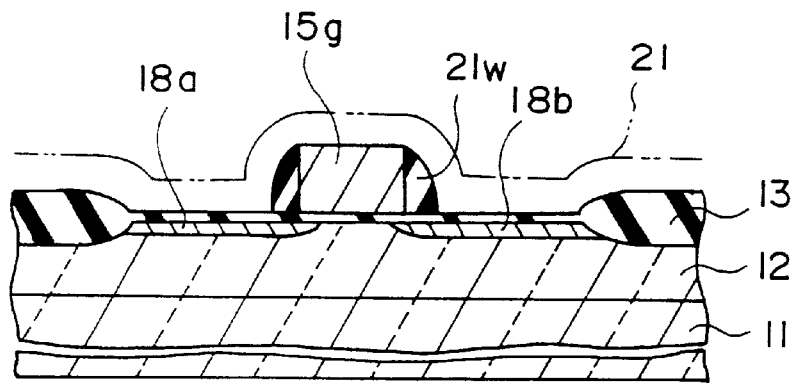
Figure 9C:
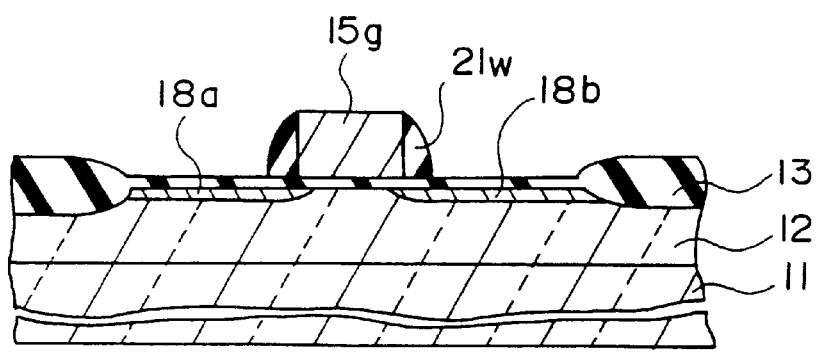

Then, as shown in FIGS. 9B and 9C, a second silicon nitride film 21 is formed on the overall surface, and then the second silicon nitride film 21 is subjected to anisotropic etching in the vertical direction to be left on both side surfaces of the gate electrode 15g, so that sidewalls 21w are formed.

Figure 9D:
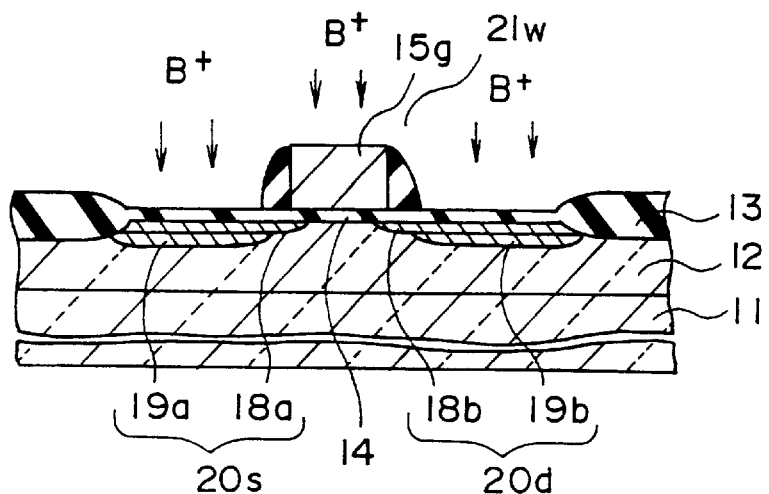

Then, as shown in FIG. 9D, the high impurity concentration regions 19a, 19b in the source layer 20s and the drain layer 20d are formed by introducing boron as the impurity into the gate electrode 15g and the wells 12 on both sides of the gate electrode 15g using the sidewalls 21w as a mask.

Figure 9E:
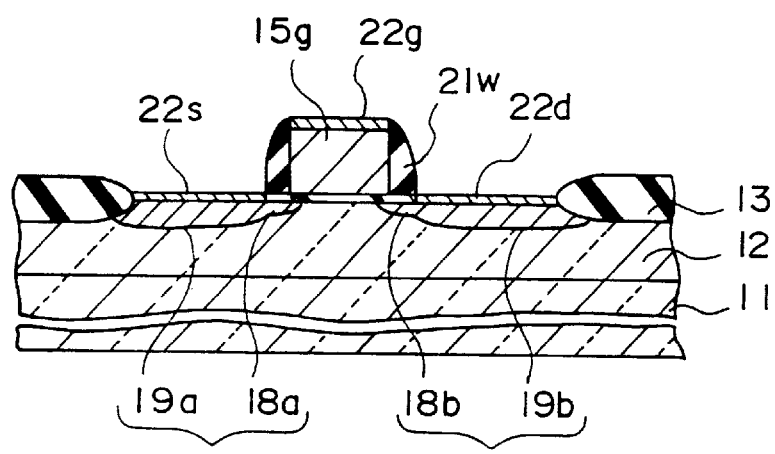

Then, as shown in FIG. 9E, silicides 22g, 22s, 22d are formed on the gate electrode 15g and on the source layer 20s and the drain layer 20d.

Figure 9F:
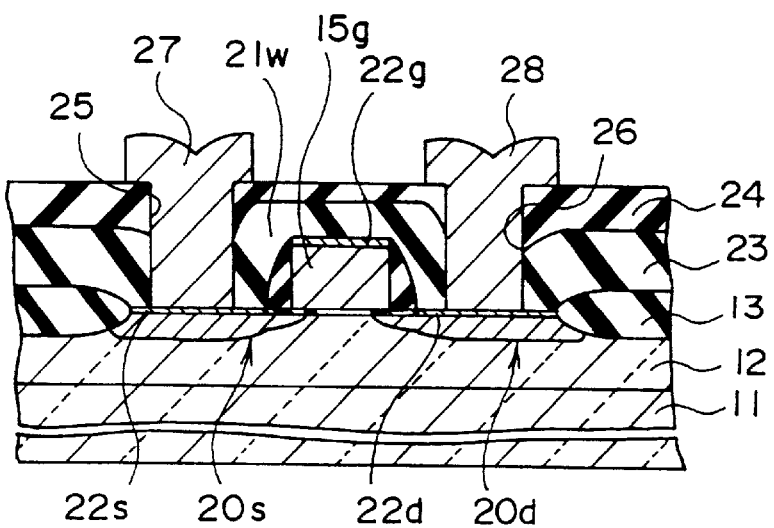

Next, as shown in FIG. 9F, interlayer insulating films 23, 24 are formed, and then source extension electrode 27 and drain extension electrode 28 are formed.

In the above explanation, the steps of forming the n-type MOS transistor have been discussed as an example of the semiconductor device formation. Similarly, formation of a p-type MOS transistor will be subjected to the substantially same steps as above. However, there are differences that p-type wells are formed on the silicon substrate 11 and also, in the steps of forming the low concentration impurity diffusion layers and the high concentration impurity diffusion layers, n-type low and high concentration impurity diffusion layers are formed by implanting arsenic ion into the p-type wells.

An $SiO_2$ film grown by the CVD method may be used as constituent material for the sidewall. In this case, as growth conditions, preferably the substrate temperature of 750° C. and an $SiH_4$ gas and an oxygen containing gas as the reaction gas may be selected, for example.

(Second Embodiment)

In this second embodiment, a case will be explained wherein a step of forming the antireflection film using silicon nitride or silicon nitride oxide which has relatively high etching rate against the hydrofluoric acid is applied to the step of manufacturing the DRAM cell.

First, as shown in FIG. 13A, a field oxide film 32 is formed on a surface of a p-type silicon substrate 31 to surround a transistor forming region, and then the MOS transistor is formed in the transistor forming region.

The MOS transistor comprises a gate insulating film 33 formed on the silicon substrate 31, a gate electrode 34 formed on the gate insulating film 33, and an n-type first impurity diffusion layer 35a and an n-type second impurity diffusion layer 35b formed on the silicon substrate 31 on both sides of the gate electrode 34.

The MOS transistor is covered with a first interlayer insulating film 36 made of $SiO_2$, and a contact hole 37 is formed on a first impurity diffusion layer 35a of the first interlayer insulating film 36. A bit line BL extending onto the field oxide film 32 is connected to the first impurity diffusion layer 35a via the contact hole 37. The bit line BL is covered with a second interlayer insulating film 38 made of $SiO_2$.

Under this situation, a thermal nitride film 39 is formed on the second interlayer insulating film 38 at the temperature of 700° C. to 800° C. by executing nitriding of a surface of the second interlayer insulation film 38 in nitrogen atmosphere.

In addition, a first $SiO_2$ film 40 is grown on the thermal nitride film 39 by the CVD method using TEOS (tetraethoxysilane).

In turn, a first polysilicon film 41 containing impurity is grown by the CVD method on the first $SiO_2$ film 40 and then a first antireflection film 42 made of silicon nitride or silicon nitride oxide is grown by the plasma CVD method on the first polysilicon film 41. Since the etching rate ratio of the $SiO_2$ film, which has been grown with the use of TEOS, to the thermal oxide film due to the hydrofluoric acid is about 6, the growth conditions should be adjusted such than the etching rate ratio of the first antireflection film 42 to the thermal oxide film due to the hydrofluoric acid becomes more than 6.

Subsequently, a second $SiO_2$, film 43, a second polysilicon film 44, a second antireflection film 45, and a third $SiO_2$ film 46 are formed in sequence on the first antireflection film 42. As the method of growing respective films from the second $SiO_2$ film 43 to the third $SiO_2$ film 46, the growth method identical to that applied to the first $SiO_2$ film 40, the first polysilicon film 41, and the first antireflection film 42 can be employed.

The silicon nitride films constituting the first antireflection film 42 and the second antireflection film 45 can be grown by the same growth method as that applied to the antireflection film 16 in the first embodiment. In particular, the substrate temperature is set in the range of 350° C. to 200° C., and the silicon nitride films are grown by use of the reaction gas containing the nitrogen gas as the dilution gas.

Then, a first resist 47 is coated on the third SiO$_2$ film 46 and then a window 47a is formed on the second impurity diffusion layer 35b by exposing/developing the first resist 47. The first antireflection film 42 and the second antireflection film 45 can prevent light reflection from the first polysilicon film 41 and the second polysilicon film 44 during such exposure.

Figure 10A:
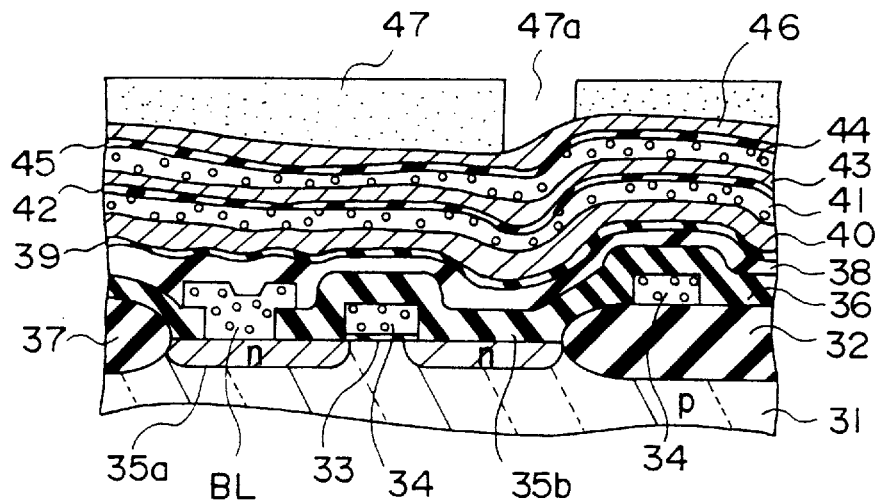
FIGS. 10A to 10F are sectional views showing steps of manufacturing a capacitor employing a antireflection film which is grown by still another embodiment of the present invention.
Figure 10B:
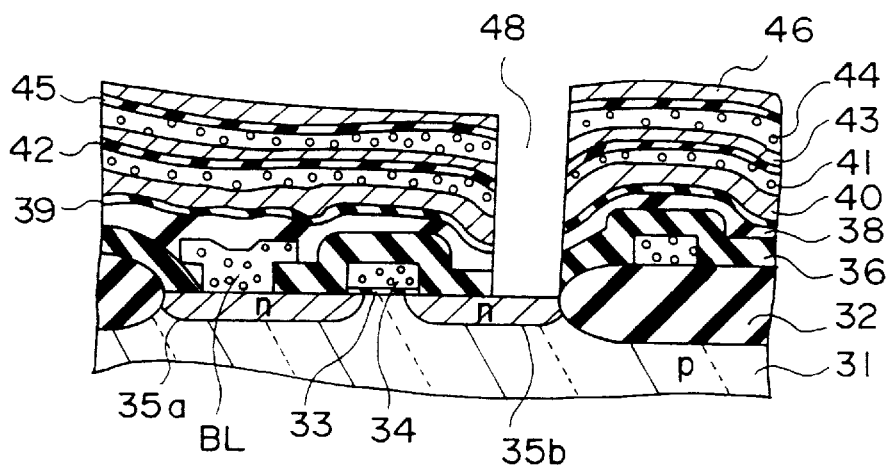

After this, as shown in FIG. 10B, films from the third SiO$_2$ film 46 to the first interlayer insulating film 36 are etched continuously via the window 47a, whereby a hole 48 can be formed.

Figure 10C:
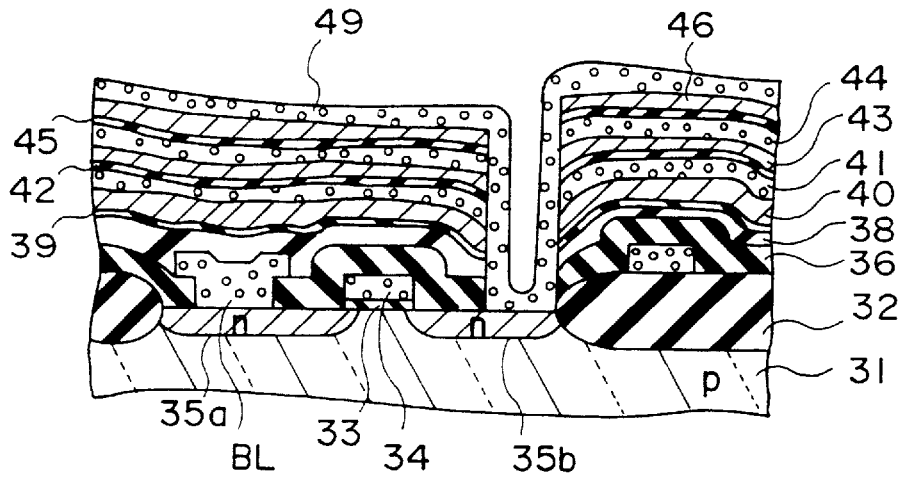

Next, as shown in FIG. 10C, a third polysilicon film 49 is grown by the CVD method in the hole 48 and on the third SiO$_2$ film 46 after the first resist 47 has been removed. It is preferable that the third polysilicon film 49 should be grown to have a substantially U-shaped sectional shape in the hole 48.

Further, a second resist (not shown) is coated on the third polysilicon film 49 and then a pattern to cover a capacitor forming region is formed by exposing/developing the second resist. In this case, the hole 48 formed on the second impurity diffusion layer 35b is positioned in a substantially central area of the capacitor forming region.

Figure 10D:
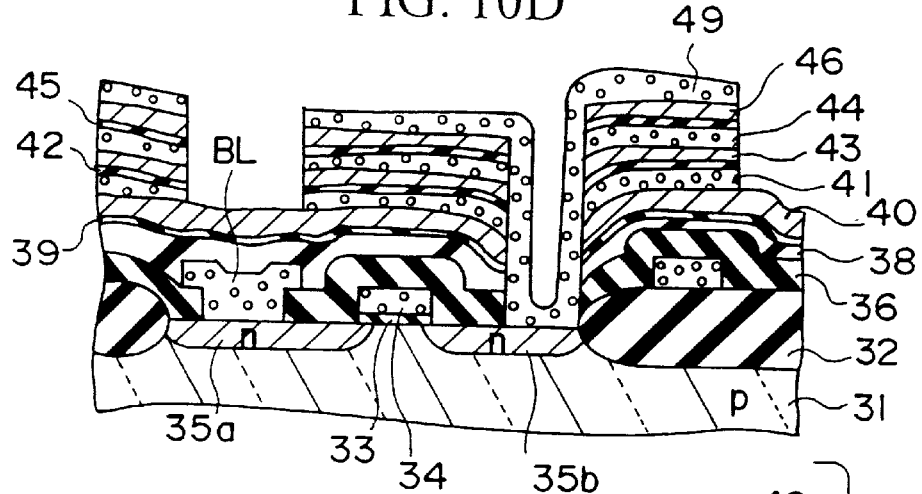
Figure 10E:
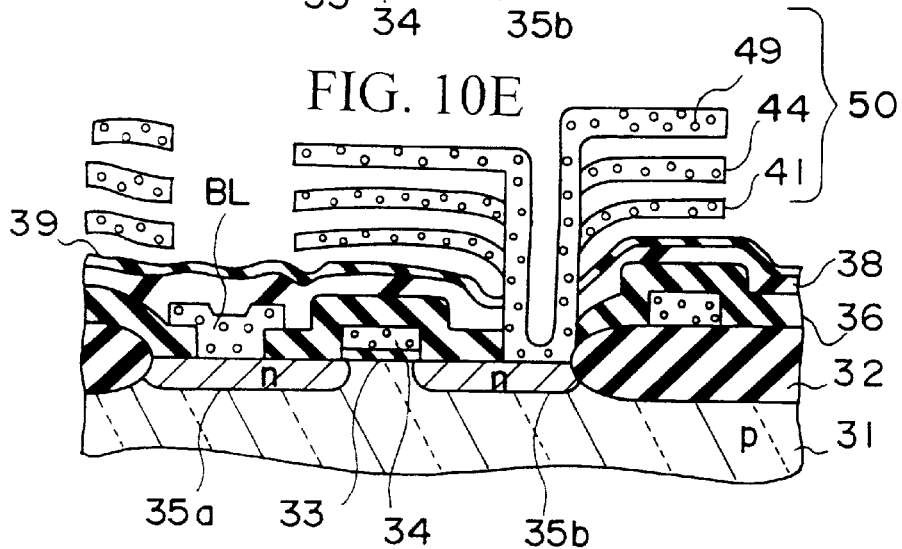

Next, as shown in FIG. 10D, respective films from the third polysilicon film 49 to the first polysilicon film 41 are etched in sequence while using patterned second resist as a mask. As a consequence, the first polysilicon film 41, the second polysilicon film 44, and the third polysilicon film 49 are patterned to have a shape as a storage electrode of a capacitor, i.e., three sheets of fin shapes.

Thereafter, as shown in FIG. 10, the first SiO$_2$ film 40, the second SiO$_2$ film 43, and the third SiO$_2$ film 46 are removed by the hydrofluoric acid, and at the same time the first antireflection film 42 and the second antireflection film 45 formed between them are removed. Since, as described above, the first antireflection film 42 and the second antireflection film 45 have been grown under the condition that they can be easily removed by the hydrofluoric acid, they never remain between the first polysilicon film 41, the second polysilicon film 44, and the third polysilicon film 49. On the contrary, the thermal nitride film 39 formed beneath the first SiO$_2$ film 40 is not readily etched by the hydrofluoric acid, so that the thermal nitride film 39 can function as an etching stop layer in hydrofluoric process.

Figure 10F:
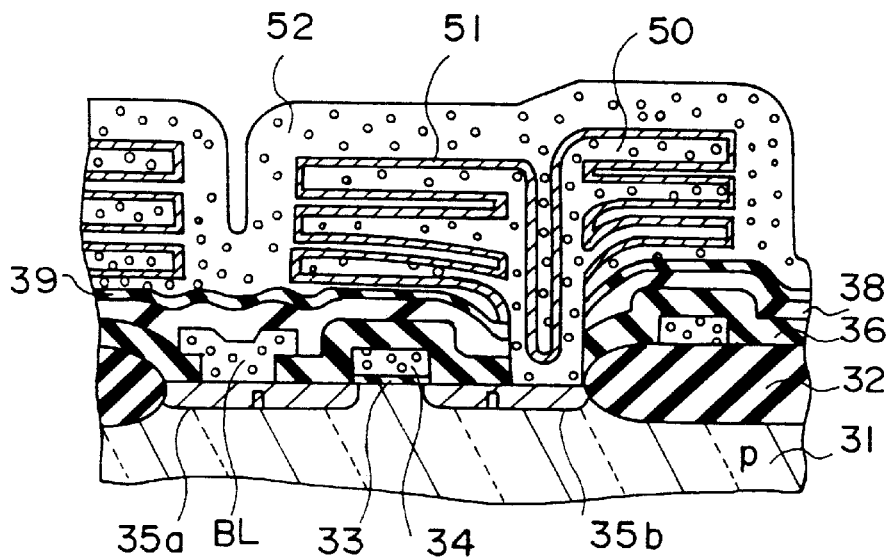
Figure 11A:
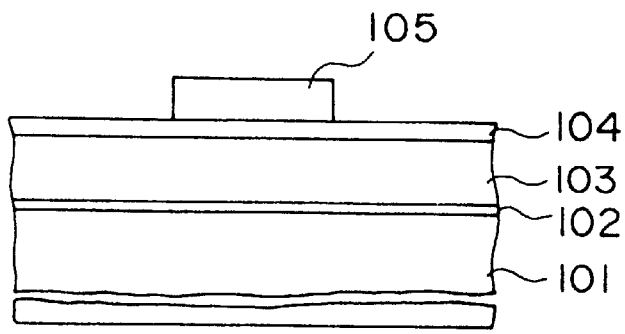
FIGS. 11A to 11D are sectional views showing an example of steps of manufacturing a MOS transistor formed according to a method in the prior art.
Figure 11B:
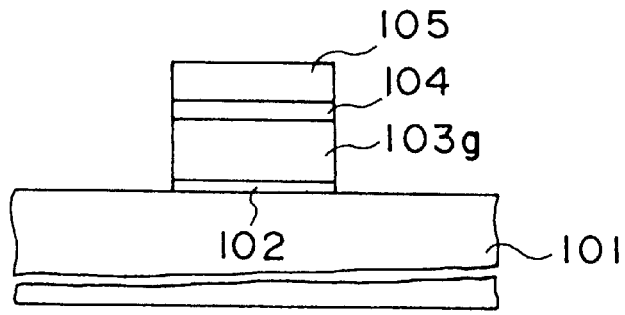
Figure 11C:
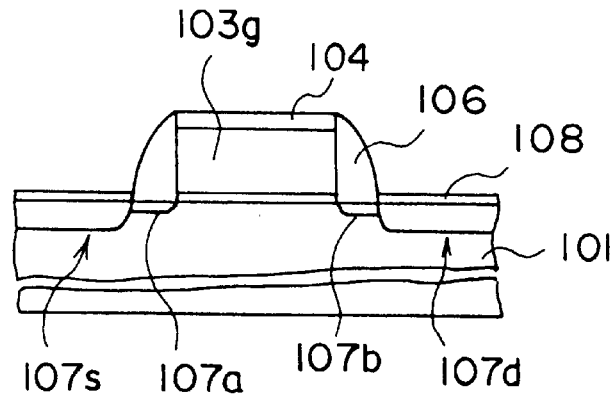
Figure 11D:
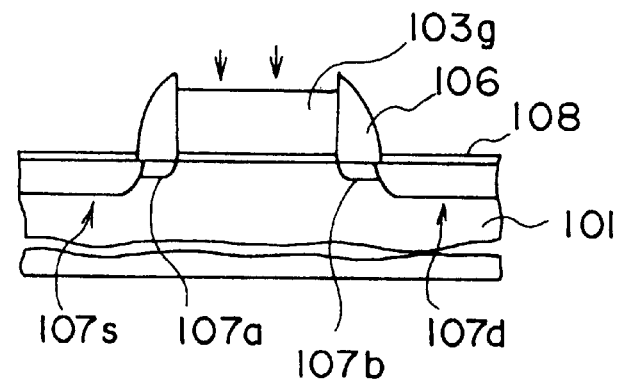

Consequently, a fin-type storage electrode 50 appears on the thermal nitride film 39. As shown in FIG. 10F, the storage electrodes 50 are covered with a dielectric film 51 such as silicon oxide, silicon nitride oxide, or the like formed by the CVD method. In addition, a surface of the dielectric film 51 is covered with a fourth polysilicon film constituting an opposing electrode 52 by virtue of the CVD method. The fourth polysilicon film contains impurity and is grown under the condition that it can cover a plurality of storage electrodes 50.

As described above, if the first antireflection film 42 and the second antireflection film 45 grown under the above conditions is employed in the steps of manufacturing the DRAM cell, the first antireflection film 42 and the second antireflection film 45 existing between fins of the storage electrodes 50 can be completely removed. As a result, reduction of a storage capacitance of the capacitor because of residue of the first antireflection film 42 and the second antireflection film 45 can be prevented.

A lower surface of the first polysilicon film 41 may come into contact with the thermal nitride film 39 by eliminating the growth of the first SiO$_2$ film 38. Otherwise, the second polysilicon film 54 may be omitted, or growth of the first SiO$_2$ film 40, the first polysilicon film 41, and the first antireflection film 42 may be repeated several times.

As described above, according to the present invention, since the silicon nitride or the silicon nitride oxide constituting the antireflection film has been grown at the growth temperature of less than 350° C. by the plasma CVD method using the reaction gas containing the dilution gas, the antireflection film having the high etching rate due to the hydrofluoric acid can be obtained. In addition, since unevenness of the surface of the semi-conductor substrate is never caused if the hydrofluoric acid is used in etching of the antireflection film, the step of growing the oxide film on the surface of the semi-conductor substrate by thermal oxidation as pre-process to remove the antireflection film can be omitted and also impurity rediffusion by the thermal oxidation can be prevented.

Furthermore, even if the silicon oxide film is used as material for the sidewall, the etching rate of the silicon nitride or silicon nitride oxide due to the hydrofluoric acid can be increased more than ten times the silicon oxide film by changing the growth conditions, so that retreat of the sidewalls can be suppressed. In the event that the silicon nitride is used as material for the sidewalls, the sidewalls are scarcely etched by the hydrofluoric acid if the silicon nitride for the sidewalls is grown by the thermal CVD method. For this reason, the antireflection film can be selectively etched and therefore retreat of the sidewalls can be prevented.

What is claimed is:

1. A method of manufacturing a semiconductor device comprising the steps of:

forming a first film above a semiconductor substrate;

introducing a reaction gas including a dilution gas into a reaction atmosphere;

growing an antireflection film made of silicon nitride or silicon nitride oxide on said first film by a plasma chemical vapor deposition method in said reaction atmosphere;

coating a resist above said antireflection film;

patterning said resist via exposure and development;

patterning said first film by etching an area of said first film not covered with said resist;

removing said resist;

forming side walls made of silicon nitride or silicon oxide on a side surface of said first film; and selectively removing said antireflection film by use of hydrofluoric acid wherein an etching rate of said antireflection film by use of said hydrofluoric acid can be adjusted by increasing or decreasing a flow rate of said dilution gas.

2. The method of manufacturing a semiconductor device of claim 1, wherein said silicon nitride or said silicon nitride oxide constituting said antireflection film is grown at a temperature of less than 350° C. and more than 200° C.

3. The method of manufacturing a semiconductor device of claim 1, wherein said dilution gas is composed of any one of nitrogen, argon, and helium.

4. The method of manufacturing a semiconductor device of claim 1, wherein said first film is a conductive film for a gate electrode which is formed on said semiconductor substrate via a gate insulating film.

5. The method of manufacturing a semiconductor device of claim 4, further comprising the step of implanting impurity ions into said semiconductor substrate on both sides of said gate electrode by use of said gate electrode as a mask either before or after said antireflection film has been removed.

6. The method of manufacturing a semiconductor device of claim 4, further comprising the step of:

implanting impurity ions into said gate electrode and said semiconductor substrate by use of said side walls as a mask.

7. The method of manufacturing a semiconductor device of claim 6, wherein said impurity ions are boron ions.

8. The method of manufacturing a semiconductor device of claim 6, wherein said side walls are made of silicon nitride or silicon oxide which is grown by a thermal chemical vapor deposition method.

9. The method of manufacturing a semiconductor device of claim 6, wherein said side walls are made of silicon oxide which is grown by a chemical vapor deposition method.

10. A method of manufacturing a semiconductor device comprising the steps of:

forming a gate electrode film above a semiconductor substrate;

introducing a reaction gas including a dilution gas into a reaction atmosphere;

growing an antireflection film made of silicon nitride or silicon nitride oxide over the gate electrode film in the reaction atmosphere;

forming a resist above the antireflection film;

patterning the resist via exposure and development;

etching the antireflection film and the gate electrode film not covered with the patterned resist;

removing the resist;

forming side walls made of silicon nitride or silicon oxide on side surfaces of the etched films;

removing the antireflection film without reducing a thickness of the side walls, wherein a flow rate of the dilution gas in said step of introducing the reaction gas is controlled to grow the antireflection film with an etching rate higher than that of the side walls.

11. The method of manufacturing the semiconductor device of claim 10, further comprising the steps of:

before forming the side walls, implanting first impurity ions into the substrate using the etched films as a mask; and before removing the antireflection film, implanting second impurity ions into the substrate using the etched films and the side walls as the mask, leaving left-over first impurity ions under the side walls, wherein the removing of the antireflection film does not reduce the thickness of the side walls that would expose a portion of the left-over first impurity ions under the side walls.

12. The method of manufacturing the semiconductor device of claim 10, further comprising the steps of:

before forming the side walls, implanting first impurity ions into the substrate using the etched films as a mask; and after removing the antireflection film, implanting second impurity ions into the substrate using the etched films and the side walls as the mask.

13. The method of manufacturing the semiconductor device of claim 10, wherein the flow rate of the dilution gas in said step of introducing the reaction gas is controlled to grow the antireflection film with the etching rate being more than ten times higher that of the side walls.

* * * * *